United States Patent
Wang (10) Patent No.: US 9,059,833 B2
(45) Date of Patent: Jun. 16, 2015

(54) DATA RECEIVING DEVICE AND METHOD THEREOF

(71) Applicant: REALTEK SEMICONDUCTOR CORPORATION, Hsinchu (TW)

(72) Inventor: Teng Yi Wang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 14/494,325

(22) Filed: Sep. 23, 2014

(65) Prior Publication Data
US 2015/0098527 A1 Apr. 9, 2015

(30) Foreign Application Priority Data
Oct. 4, 2013 (TW) .............................. 102136128 A (51) Int. Cl.
*H03D 3/24* (2006.01)
*H04L 7/00* (2006.01)
*H04L 7/033* (2006.01)

(52) U.S. Cl.
CPC .............. *H04L 7/0079* (2013.01); *H04L 7/033* (2013.01)

(58) Field of Classification Search
None
See application file for complete search history.

(56) References Cited

U.S. PATENT DOCUMENTS

2010/0109795 A1 * 5/2010 Jones et al. .................... 333/101

* cited by examiner

*Primary Examiner* — Adolf Dsouza
(74) *Attorney, Agent, or Firm* — WPAT, P.C.; Anthony King (57) ABSTRACT

This invention discloses a data receiving device and method thereof for identifying a transmission mode of a data signal. The method includes steps of: generating a first reference clock according to a source clock; generating a phase detection signal according to the data signal and a data recovery clock; adjusting the phase of the first reference clock according to the phase detection signal to generate the data recovery clock; generating a second reference clock according to the phase detection signal and the first reference clock, the second reference clock and the data recovery clock having the same frequency and a phase difference; detecting the transmission mode according to the second reference clock and the data signal to generate a mode signal; and deciding whether to change the frequency of the first reference clock according to the mode signal.

20 Claims, 12 Drawing Sheets

DATA RECEIVING DEVICE AND METHOD THEREOF

BACKGROUND OF THE INVENTION

1. Field of the Invention

The present invention relates to a data receiving device and its associated method, especially to a data receiving device and its associated method of High Definition Multimedia Interface (HDMI).

2. Description of Related Art

Figure 1:
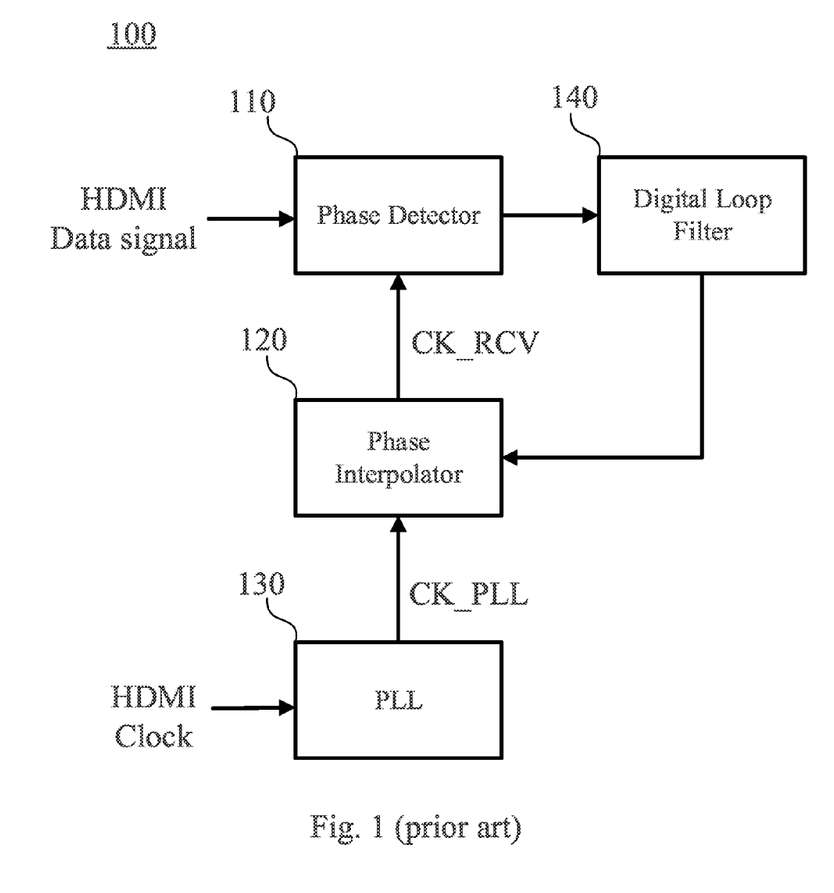
FIG. 1 illustrates a conventional data receiving device 100 of an HDMI receiving end.

HDMI is a common audio and video transmission interface. Please refer to FIG. 1, illustrating a conventional data receiving device 100 of an HDMI receiving end. The data receiving device 100 includes a phase detector (PD) 110, a phase interpolator (PI) 120, a phase lock loop (PLL) 130 and a digital loop filter 140. The original HDMI signal usually includes an HDMI data signal and an HDMI clock. The HDMI data signal may include color information of images. After being properly processed, the HDMI clock can be used for sampling the HDMI data signal to recover the color information. As shown in FIG. 1, the PLL 130 generates a reference clock CK_PLL by referring to the HDMI clock. The reference clock CK_PLL is in phase with the HDMI clock but its frequency is a multiple of the frequency of the HDMI clock. The PI 120 adjusts the phase of the reference clock CK_PLL and outputs a data recovery clock CK_RCV to the PD 110. The PD 110 compares the phases of the HDMI data signal and the data recovery clock CK_RCV and outputs a phase detection signal that indicates a phase relation between these two signals, according to which the PI 120 adjusts the phase of the reference clock CK_PLL. Practically, the data recovery clock CK_RCV may probably be unstable if the phase detection signal changes rapidly during the phase adjustment of the PI 120, and to prevent this situation from happening, the digital loop filter 140 is usually used to make the phase detection signal a relatively stable signal in time by filtering out its high frequency part.

The HDMI transmission modes includes HDMI 1.4 and HDMI 2.0, which are widely used or will be common soon. According to the HDMI 1.4 specification, the data rate of the HDMI data signal ranges from 250 Mbps to 3.4 Gbps and its corresponding HDMI clock ranges from 25 MHz to 340 MHz; on the other hand, according to the HDMI 2.0 specification, the data rate of the HDMI data signal ranges from 3.4 Gbps to 6 Gbps and its corresponding HDMI clock ranges from 85 MHz to 150 MHz. Please refer to FIG. 1. When the data receiving device 100 is applied to equipment supporting only HDMI 1.4, the PLL 130 can always use a frequency multiple of 10 to make the frequency of the reference clock CK_PLL be 10 times the frequency of the HDMI clock, which is identical to the frequency of the HDMI data signal. Therefore, the data recovery clock CK_RCV, which is generated by properly adjusting the phase of the reference clock CK_PLL, can be used to sample the HDMI data signal to recovery the data carried by the HDMI data signal. Similarly, when the data receiving device 100 is applied to equipment supporting only HDMI 2.0, the PLL 130 uses a frequency multiple of 40 to make the frequency of the reference clock CK_PLL be 40 times the frequency of the HDMI clock, which is identical to the frequency of the HDMI data signal, so as to sample the HDMI data signal. Considering a case that the data receiving device 100 is applied to equipment supporting HDMI 1.4 and HDMI 2.0 at the same time, if the frequency multiple of the PLL 130 is determined by detecting the frequency of the HDMI clock, for example, if the HDMI clock is detected to be in the range of 25 MHz~85 MHz or 150 MHz~340 MHz, the data receiving device 100 finds that the transmission mode in use is HDMI 1.4 and determines the frequency multiple to be 10; if, however, the frequency of the HDMI clock is detected to be in the range of 85 MHz~150 MHz, the data receiving device 100 cannot determine the transmission mode of the HDMI data signal.

Another applicable method is to utilize the display data channel (DDC) to transmit the HDMI mode in use so that the HDMI receiving end can determine the HDMI mode when receiving the HDMI data signal. If, however, the transmission of this information is not agreed in advance between the transmission end and the receiving end or interferences which cause data loss occur during the information transmission, the data receiving device 100 cannot operate properly and therefore the audio and video contents cannot be presented normally.

SUMMARY OF THE INVENTION

In consideration of the imperfections of the prior art, an object of the present invention is to provide a data receiving device and its associated method, so as to make an improvement to the prior art.

The present invention discloses a data receiving device for identifying a transmission mode of a data signal, comprising: a clock generating circuit for generating a first reference clock according to a source clock; a phase detector for generating a phase detection signal according to the data signal and a data recovery clock; a phase adjusting circuit, coupled to the clock generating circuit and the phase detector, for adjusting a phase of the first reference clock according to the phase detection signal to generate the data recovery clock and outputting the data recovery clock to the phase detector and generating a second reference clock according to the phase detection signal and the first reference clock, the second reference clock and the data recovery clock having the same frequency and a phase difference; a mode detector, coupled to the phase adjusting circuit, for detecting the transmission mode according to the second reference clock and the data signal and generating a mode signal accordingly; and a control circuit, coupled to the mode detector and the clock generating circuit, for determining whether to control the clock generating circuit to change the frequency of the first reference clock or not according to the mode signal.

The present invention also discloses a data receiving method, performed by a data receiving device for identifying a transmission mode of a data signal, comprising: generating a first reference clock according to a source clock; generating a phase detection signal according to the data signal and a data recovery clock; generating the data recovery clock by adjusting a phase of the first reference clock according to the phase detection signal; generating a second reference clock according to the phase detection signal and the first reference clock, the second reference clock and the data recovery clock having the same frequency and a phase difference; detecting the transmission mode according to the second reference clock and the data signal and generating a mode signal accordingly; and determining whether to change the frequency of the first reference clock or not according to the mode signal.

The present invention further discloses a data receiving device for identifying a transmission mode of a data signal, comprising: a first clock generating circuit for generating a first reference clock according to a source clock; a second clock generating circuit, coupled to the first clock generating circuit, for generating a second reference clock according to the first reference clock and the data signal; a delaying circuit, coupled to the second clock generating circuit, for delaying the second reference clock to generate a third reference clock, the third reference clock and the second reference clock having a time difference; a mode detector, coupled to the delaying circuit, for detecting the transmission mode according to the third reference clock and the data signal and generating a mode signal accordingly; and a control circuit, coupled to the mode detector and the first clock generating circuit, for determining whether to control the first clock generating circuit to change the frequency of the first reference clock or not according to the mode signal.

The present invention further discloses a data receiving method, performed by a data receiving device for identifying a transmission mode of a data signal, comprising: generating a first reference clock according to a source clock; generating a second reference clock according to the first reference clock and the data signal; delaying the second reference clock to generate a third reference clock, the third reference clock and the second reference clock having a time difference; detecting the transmission mode according to the third reference clock and the data signal and generating a mode signal accordingly; and determining whether to change the frequency of the first reference clock or not according to the mode signal.

The data receiving device and its associated method of the present invention can detect a transmission mode of a data signal so as to use a correct sampling frequency to recover data. Compared with the related art, it is not required to have the data transmitting end and the data receiving end agree with a communication of the transmission mode in advance so the data receiving end of the present invention can match various types of data transmitting ends. In addition, the present invention can prevent display of abnormal audio and video contents from happening that is caused by interferences or data loss during the communication of the transmission mode.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description is written by referring to terms of this invention field. If any term is defined in the specification, such term should be explained accordingly. Besides, the connection between objects or events in the following embodiments can be direct or indirect provided that these embodiments are still applicable under such connection. Said "indirect" means that an intermediate object or a physical space exists between the objects, or an intermediate event or a time interval exists between the events. The present invention discloses a data receiving device and its associated method, and the detail known in this field will be omitted if such detail has little to do with the features of the present invention. People of ordinary skill in the art can choose components or steps equivalent to those described in this specification to carry out the present invention, which means that the scope of this invention is not limited to the embodiments in the specification. On account of that some or all elements of said device invention could be known, the detail of such elements will be omitted provided that this omission nowhere dissatisfies the specification and enablement requirements. The following description on the method invention will focus on the processes and steps instead of the hardware without dissatisfying the specification and enablement requirements.

Figure 2:
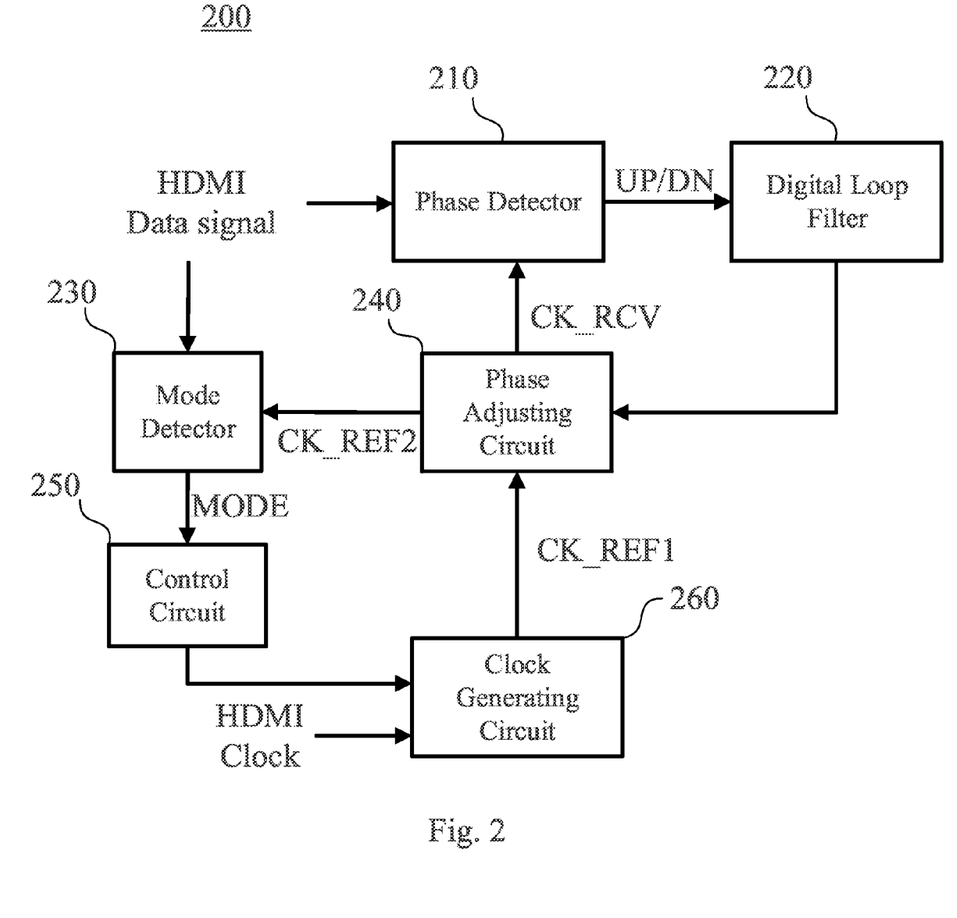
FIG. 2 illustrates a data receiving device according to an embodiment of the present invention.

Please refer to FIG. 2, illustrating a data receiving device according to an embodiment of the present invention. A function of the data receiving device 200 is to receive data signal and clock, adjust the frequency and the phase of the clock and sample the data signal by the clock to recover the data carried by the data signal. The data receiving device 200 of the present invention can be applied to an HDMI receiving end, and in this case the HDMI data signal carries color information of images such as RGB information. The HDMI clock is received by the clock generating circuit 260 and the frequency is multiplied to generate a reference clock CK_REF1. According to the specifications of HDMI 1.4 and HDMI 2.0, as mentioned in the related art, the frequency ratio of the HDMI data signal to the HDMI clock is 10 and 40 respectively, and thus the control circuit 250 can control a default frequency multiple of the clock generating circuit 260 to be 10 or 40. If the data receiving device 200 assumes that the transmission mode of the HDMI data signal is HDMI 1.4, the default frequency multiple of the clock generating circuit 260 is set to be 10; if the data receiving device 200 assumes that the transmission mode of the HDMI data signal is HDMI 2.0, the default frequency multiple of the clock generating circuit 260 is set to be 40. The main function of the clock generating circuit 260 is to raise the frequency of the HDMI clock; therefore any circuit capable of performing this function, such as a phase lock loop, can be used to implement the clock generating circuit 260.

The phase adjusting circuit 240 initially adjusts the phase of the reference clock CK_REF1 according to a predetermined value and generates a data recovery clock CK_RCV, which means that the data recovery clock CK_RCV and the reference clock CK_REF1 have the same frequency, and then the phase adjusting circuit 240 transmits the data recovery clock CK_RCV to the phase detector 210. The phase detector 210 compares the HDMI data signal and the data recovery clock CK_RCV and generates a phase detection signal UP/DN that indicates a phase relation between these two signals. The phase adjusting circuit 240 can determine the manner of adjusting the phase by directly referring to the phase detection signal UP/DN; however, practically the phase detection signal UP/DN may change so rapidly that the circuit becomes unstable so generally the phase detection signal UP/DN is filtered by a low-pass filter such that the filtered phase detection signal UP/DN has only the low frequency part left and therefore becomes smoother. Any circuit capable of performing this function can be used as the filter, and the present invention utilizes a digital loop filter 220. However, if the changes of the phase detection signal UP/DN are acceptable, the digital loop filter 220 can be saved.

Figure 3:
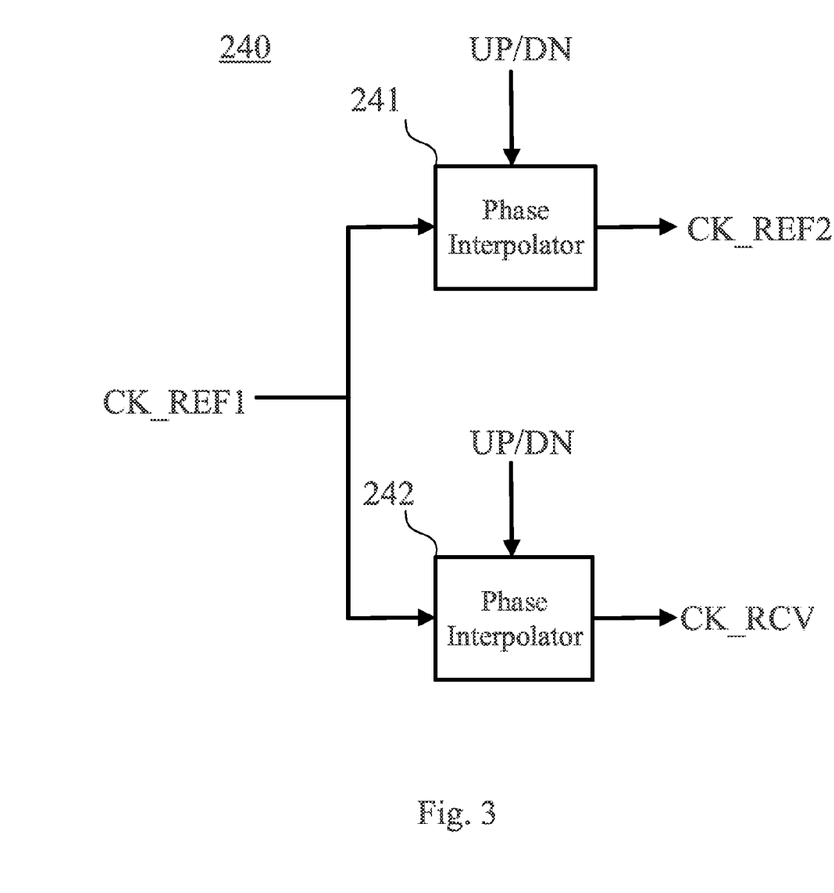
FIG. 3 illustrates the phase adjusting circuit 240 according to an embodiment of the present invention.

The phase adjusting circuit 240 adjusts the phase of the reference clock CK_REF1 according to the phase detection signal UP/DN and generates the data recovery clock CK_RCV accordingly so that the data recovery clock CK_RCV is in phase with the HDMI data signal and can therefore be used to sample the HDMI data signal accurately. In addition the phase adjusting circuit 240 also generates another reference clock CK_REF2, which has the same frequency as the data recovery clock CK_RCV but may have a phase difference. Please to FIG. 3, illustrating the phase adjusting circuit 240 according to an embodiment of the present invention. The phase adjusting circuit 240 comprises a phase interpolator 241 and a phase interpolator 242, both adjusting the phase of the reference clock CK_REF1 by referring to the phase detection signal UP/DN. The phase interpolator 241 and the phase interpolator 242 generate the data recovery clock CK_RCV and the reference clock CK_REF2 respectively by interpolating the reference clock CK_REF1 and makes these two signals have a phase difference. In a preferred embodiment, the phase difference is larger than 0° and smaller than 180°. Generally the phase interpolator 241 and 242 has a phase adjusting range of K steps; i.e., if the phase of the data recovery clock CK_RCV is Φ, the phase of the reference clock CK_REF2 will be (Φ±N×360°/K), where 0<N<K/2.

Figure 4:
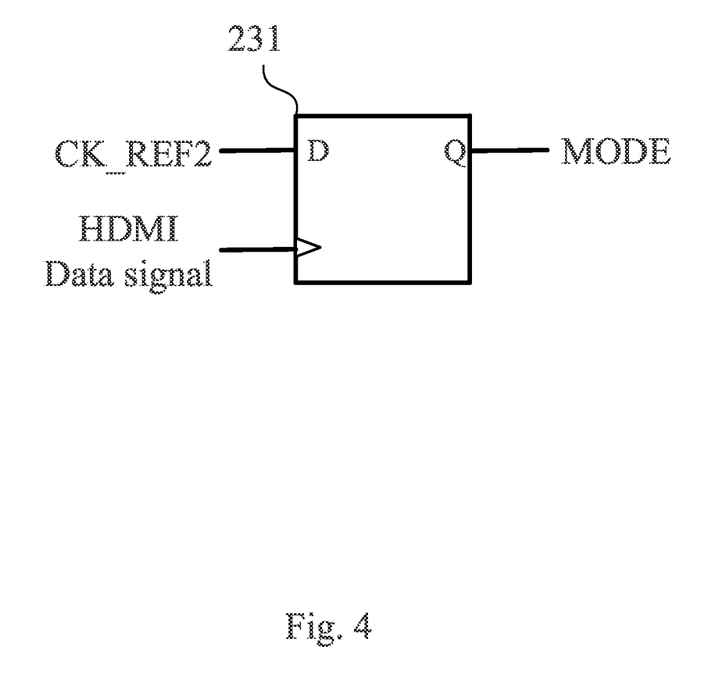
FIG. 4 illustrates the mode detector 230 according to an embodiment of the present invention.
Figure 5:
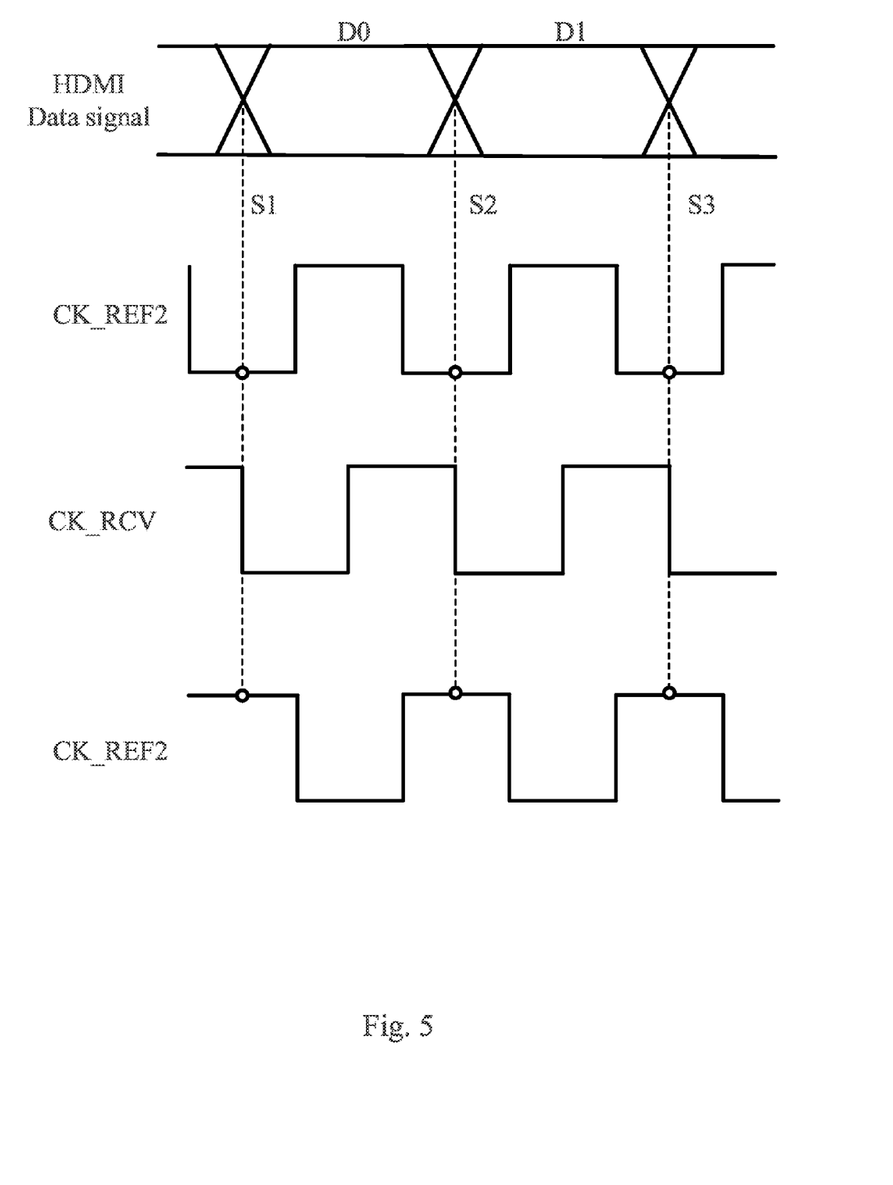
FIG. 5 illustrates a timing diagram of sampling the reference clock CK_REF2 by the HDMI data signal according to an embodiment of the present invention.

Please refer to FIG. 2 again. The phase adjusting circuit 240 outputs the reference clock CK_REF2 to the mode detector 230. The function of the mode detector 230 is to detect the transmission mode of the HDMI data signal, e.g., either HDMI 1.4 or HDMI 2.0 in an illustrative embodiment. The mode detector 230 generates the mode signal MODE according to the HDMI data signal and the reference clock CK_REF2. To be more specific, the mode detector 230 samples the reference clock CK_REF2 by the HDMI data signal to generate the mode signal MODE. Please refer to FIG. 4, illustrating the mode detector 230 according to an embodiment of the present invention. The mode detector 230 is implemented by a D flip-flop 231, which receives the HDMI data signal at its clock input end, receives the reference clock CK_REF2 at its data input end, and outputs the mode signal MODE at its output. The mode detector 230 is not limited to the D flip-flop 231; actually, any circuit capable of performing "sampling the reference clock CK_REF2 by the HDMI data signal" can be used as the mode detector 230. Please refer to FIG. 5, illustrating a timing diagram of sampling the reference clock CK_REF2 by the HDMI data signal according to an embodiment of the present invention. The reference clock CK_REF2 may be early or late with respect to the data recovery clock CK_RCV as shown by the waveforms above and below the data recovery clock CK_RCV respectively in FIG. 5. In this example, the data recovery clock CK_RCV and the reference clock CK_REF2 have a phase difference of 90°. As mentioned above, in one preferred embodiment the phase difference between the data recovery clock CK_RCV and the reference clock CK_REF2 is larger than 0° and smaller than 180°. If the phase difference is one of the two values, the sampling time (presented by dotted lines) of the HDMI data signal will be approximately on the rising or falling edges of the reference clock CK_REF2 and unstableness may probably occur. If the D flip-flop 231 of FIG. 4 is a double edge triggered flip-flop, the waveforms shown in FIG. 5 will generate 3 sampling points S1, S2 and S3. In this illustrative example where the data recovery clock CK_RCV and the HDMI data signal are in phase, these three sampling points all correspond to data 0 (i.e., a low voltage level) for the reference clock CK_REF2 with early phase; on the contrary, these three sampling points all correspond to data 1 (i.e., a high voltage level) for the reference clock CK_REF2 with late phase. Either way, the mode signal MODE is a stable signal with a constant value. If the D flip-flop 231 of FIG. 4 is a single edge triggered flip-flop, the sampling points in FIG. 5 will only have S1 and S3, which, however, results in the same stable mode signal MODE with a constant value. A mode signal MODE with constant value indicates that the HDMI data signal and the data recovery clock CK_RCV have the same frequency. Since a ratio of the frequency of the data recovery clock CK_RCV, i.e., the frequency of the reference clock CK_REF1, to the frequency of the HDMI clock is a particular value, which is the default frequency multiple of the clock generating circuit 260, the mode signal MODE with constant value also indicates that a ratio of the frequency of the HDMI data signal to the frequency of the HDMI clock is of the same value. For example, if the data receiving device 200 assumes that the transmission mode of the HDMI data signal is HDMI 1.4, the default frequency multiple of the clock generating circuit 260 is set to be 10; and the mode signal MODE with constant value proves that the assumptions is true, which means the transmission mode is HDMI 1.4. Similarly the situation where the transmission mode is assumed to be HDMI 2.0 can be easily derived by person of ordinary skill in the art so descriptions are omitted for brevity.

Figure 6:
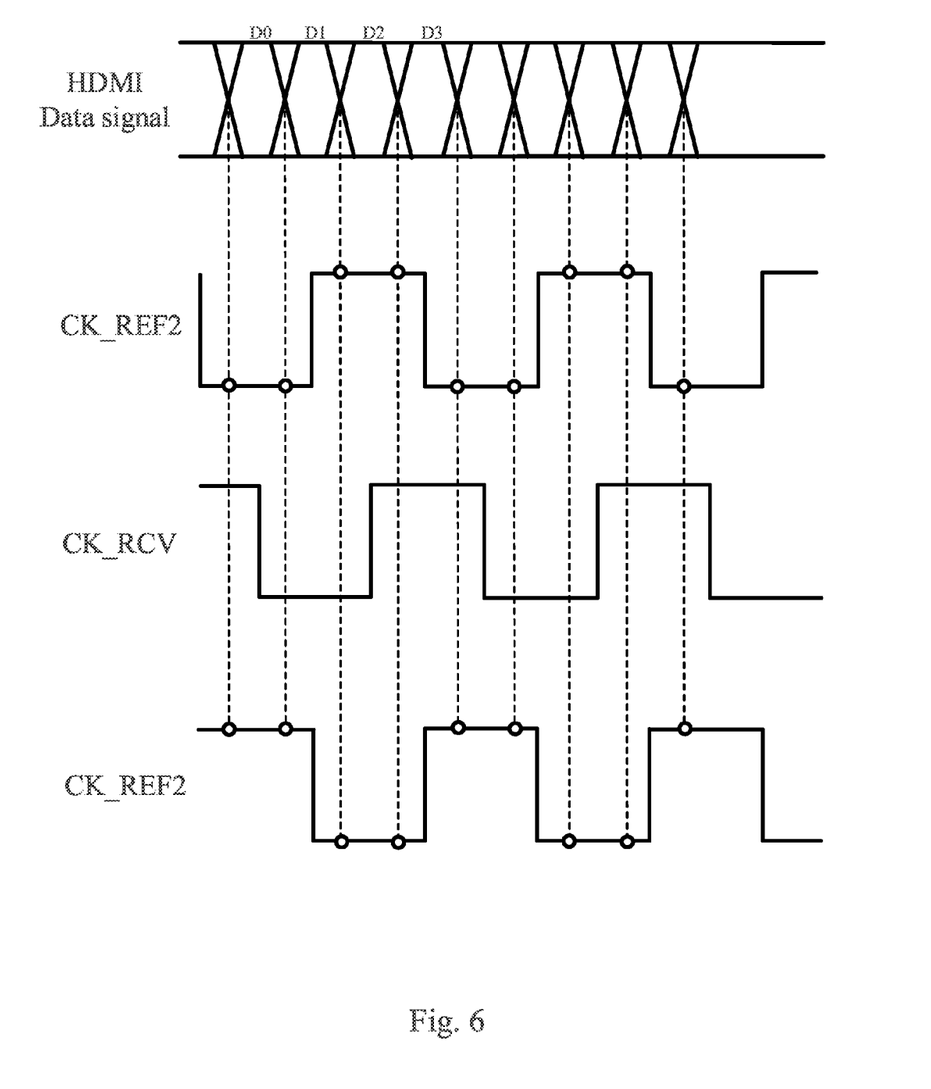
FIG. 6 illustrates a timing diagram of sampling the reference clock CK_REF2 by the HDMI data signal according to another embodiment of the present invention.

Please refer to FIG. 6, illustrating a timing diagram of sampling the reference clock CK_REF2 by the HDMI data signal according to another embodiment of the present invention. This illustrative example shows a situation where the data recovery clock CK_RCV and the HDMI data signal are not in phase. One reason for this situation is when the control circuit 250 controls the clock generating circuit 260 to generate the reference clock CK_REF1 by a default frequency multiple of 10 but the HDMI data signal is of the HDMI 2.0 mode. As a result, the frequency of the HDMI data signal is 4 times the frequency of the data recovery clock CK_RCV or the reference clock CK_REF2, as shown in FIG. 6. The sampling results obtained by using the HDMI data signal to sample the reference clock CK_REF2 shows that the mode signal MODE is a periodic signal bouncing between high and low voltage levels (e.g., 00110010 . . . for the reference clock CK_REF2 with early phase and 110011001 . . . for the reference clock CK_REF2 with late phase) instead of a signal with constant value. This kind of mode signal MODE indicates that a ratio of the frequency of the HDMI data signal to the frequency of the HDMI clock is not the default frequency multiple of the clock generating circuit 260. For example, if the data receiving device 200 assumes that the transmission mode of the HDMI data signal is HDMI 1.4, the clock generating circuit 260 is controlled to use a default frequency multiple of 10 to generate the reference clock CK_REF1; then the mode signal MODE with variant value indicates that the assumption is wrong, and consequently the transmission mode is HDMI 2.0 instead of HDMI 1.4. Similarly the situation where the transmission mode is assumed to be HDMI 2.0 can be easily derived by person of ordinary skill in the art so descriptions are omitted for brevity. The waveforms shown in FIG. 6 is also depicted as an example of a double edge triggered D flip-flop; if, however, a single edge triggered D flip-flop is used, either even or odd sampling results are left but the result is not altered.

Please refer to FIG. 2 again. The control circuit 250 controls the clock generating circuit 260 according to the mode signal MODE so as to keep or change the frequency of the reference clock CK_REF1. If the value of the mode signal MODE does not change over time, which indicates that the frequency multiple of the clock generating circuit 260 is correct, i.e., the actual transmission mode is the same as the assumed transmission mode so that the data recovery clock CK_RCV is able to sample the HDMI data signal correctly (as shown in FIG. 5), the control circuit 250 does not control the clock generating circuit 260 to change the frequency of the reference clock CK_REF1; on the contrary, if the value of the mode signal MODE changes over time, which indicates that the frequency multiple of the clock generating circuit 260 is not correct, i.e., the actual transmission mode is the other transmission mode instead of the assumed one so that the data recovery clock CK_RCV is not able to sample the HDMI data signal correctly (as shown in FIG. 6), the control circuit 250 has to control the clock generating circuit 260 to change the frequency of the reference clock CK_REF1.

In short, the present invention can determine the transmission mode of the HDMI data signal according to the mode signal MODE. For example, assuming that the default frequency multiple of the clock generating circuit 260 is 10 and if the value of the mode signal MODE is constant, the transmission mode of the HDMI data signal is HDMI 1.4; on the contrary, if the value of the mode signal MODE changes over time, the transmission mode of the HDMI data signal is HDMI 2.0. Similarly, if the default frequency multiple of the clock generating circuit 260 is 40, an opposite result will be obtained.

Figure 7:
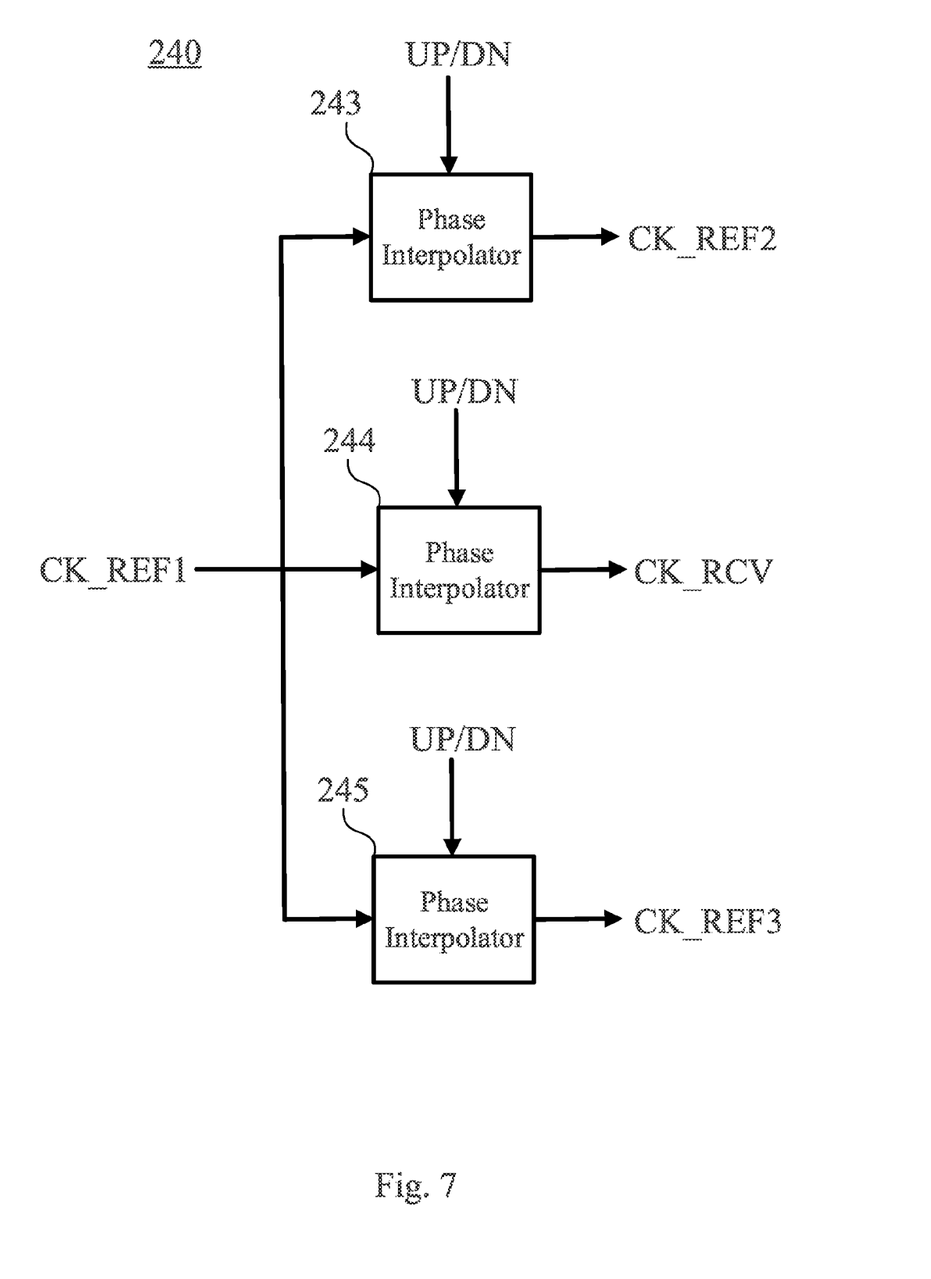
FIG. 7 illustrates the phase adjusting circuit 240 according to another embodiment of the present invention.
Figure 8:
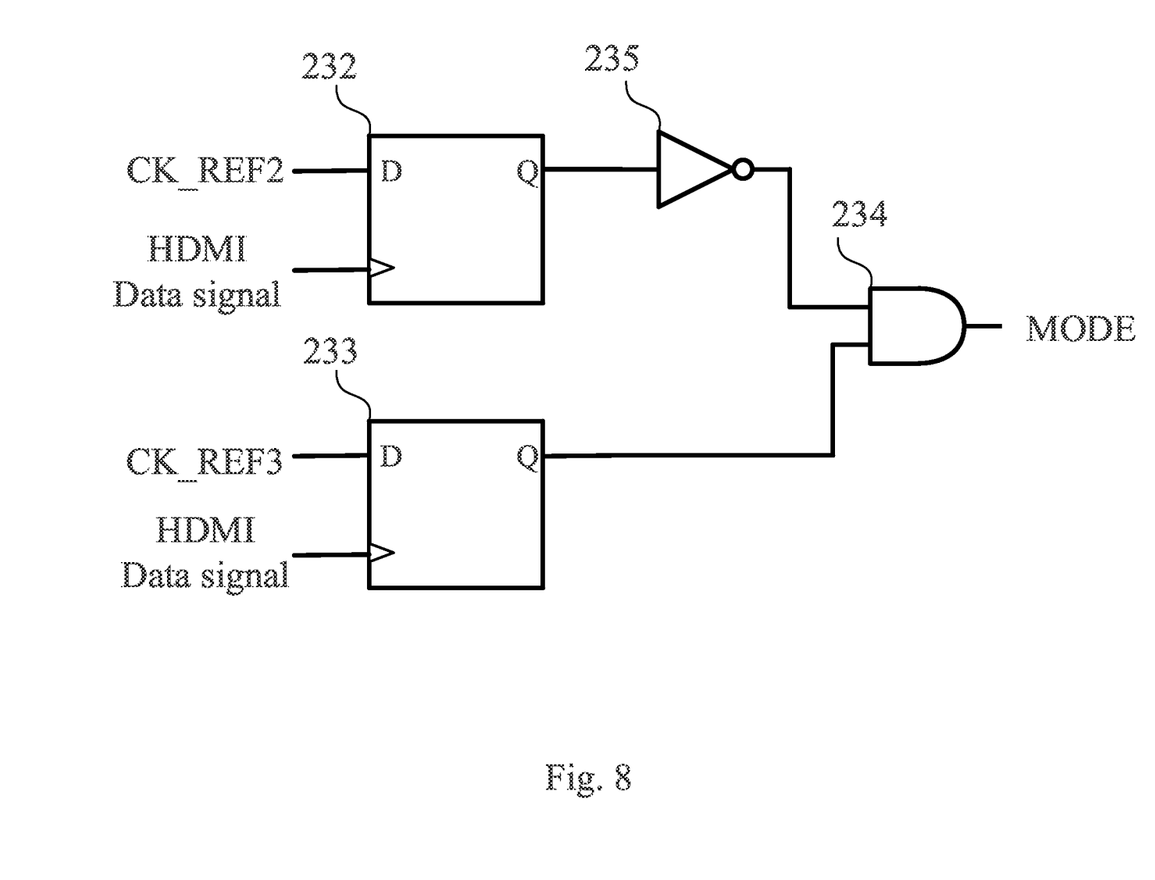
FIG. 8 illustrates the mode detector 230 according to another embodiment of the present invention.

Please refer to FIG. 7, illustrating the phase adjusting circuit 240 according to another embodiment of the present invention. In this embodiment, the phase adjusting circuit 240 comprises three phase interpolators 243, 244, and 245 for respectively generating the reference clock CK_REF2, the data recovery clock CK_RCV, and a reference clock CK_REF3. The phase of the reference clock CK_REF2 is ahead of the data recovery clock CK_RCV by a phase difference while the phase of the reference clock CK_REF3 is behind the data recovery clock CK_RCV by the same phase difference. The phase difference is between 0° and 180°. In response to this modification of the phase adjusting circuit 240, the mode detector 230 is modified accordingly. Please refer to FIG. 8, illustrating the mode detector 230 according to another embodiment of the present invention. In this embodiment, the mode detector 230 is implemented by two D flip-flops 232 and 233, where each of them receives the HDMI data signal at its clock input end, receives the reference clock CK_REF2 or the reference clock CK_REF3 at its data input end, and the output end of the D flip-flop 233 is coupled directly to one input of the AND gate 234 while the output end of the D flip-flop 232 is coupled to the other input of the AND gate 234 through the NOT gate 235. The embodiment of FIG. 7 and FIG. 8 has the same result as the embodiment of FIG. 3 and FIG. 4, but the signal becomes more stable.

Figure 9:
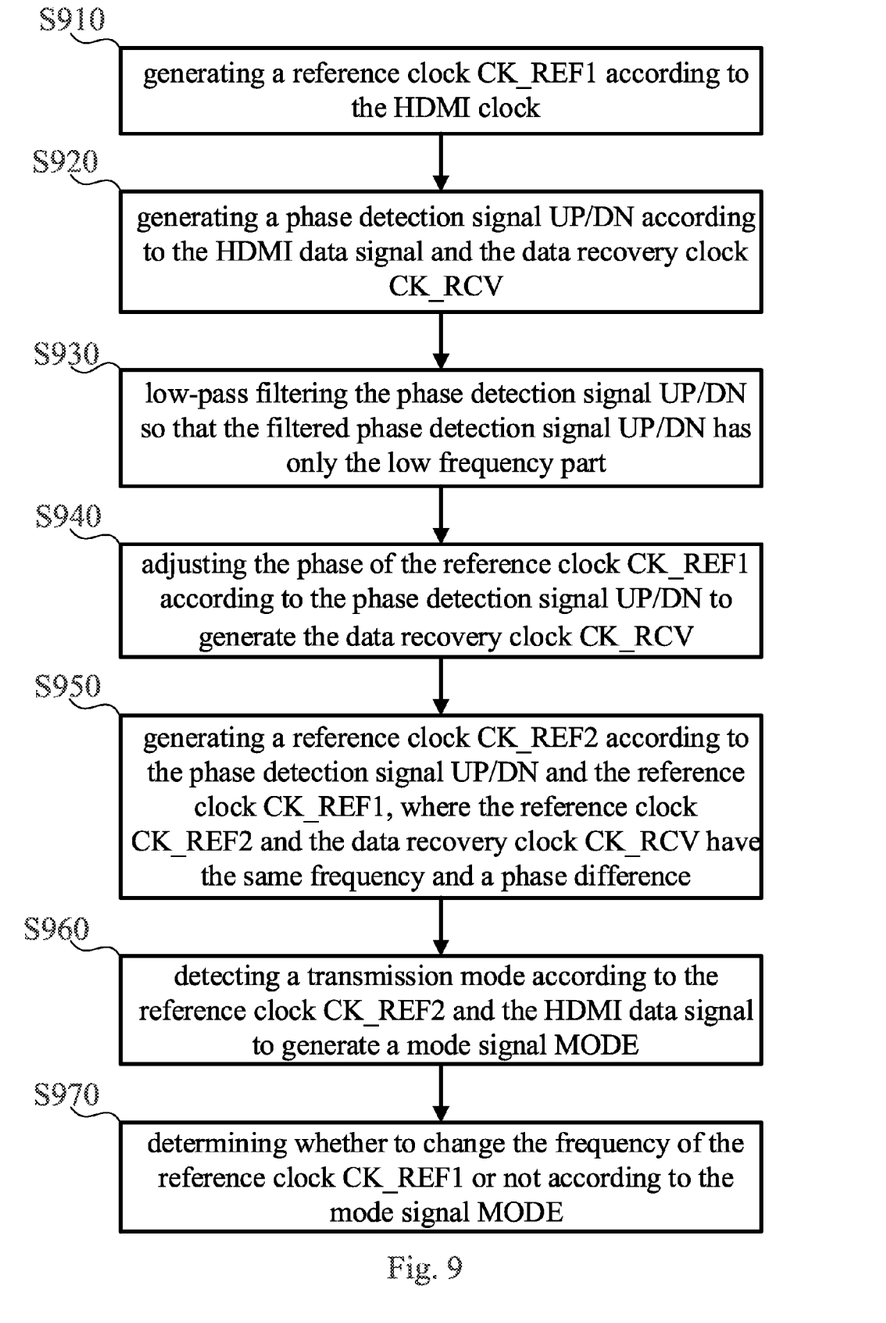
FIG. 9 illustrates a flow chart of a data receiving method according to an embodiment of the present invention.

Please refer to FIG. 9, illustrating a flow chart of a data receiving method according to an embodiment of the present invention. In addition to the aforementioned data receiving device, the present invention also discloses a corresponding data receiving method, which is applied to a receiving end of HDMI for identifying a transmission mode of the data signal. This method is executed by the data receiving device 200 or its equivalent device. As shown in FIG. 9, one embodiment of the present invention comprises the following steps:

Step S910: generating a reference clock CK_REF1 according to the HDMI clock. The original HDMI signal usually comprises the HDMI data signal and the HDMI clock. This step assumes that the transmission mode of HDMI is HDMI 1.4 or HDMI 2.0, and uses a corresponding default frequency multiple (10 for HDMI 1.4 and 40 for HDMI 2.0) to generate the reference clock CK_REF1 so that a ratio of the frequency of the reference clock CK_REF1 to the frequency of the HDMI clock is the default frequency multiple;

Step S920: generating a phase detection signal UP/DN according to the HDMI data signal and the data recovery clock CK_RCV. The data recovery clock CK_RCV is used to sample the HDMI data signal to recover data. The phase detection signal UP/DN indicates a phase relation between the HDMI data signal and the data recovery clock CK_RCV;

Step S930: low-pass filtering the phase detection signal UP/DN so that the filtered phase detection signal UP/DN has only the low frequency part. In practical, the phase detection signal UP/DN may probably change so rapidly that the circuit becomes unstable, and thus the phase detection signal UP/DN is low-pass filtered to smoothen the signal. However, if the changes of the phase detection signal UP/DN are acceptable, this step can be omitted;

Step S940: adjusting the phase of the reference clock CK_REF1 according to the phase detection signal UP/DN to generate the data recovery clock CK_RCV. Ideally, the data recovery clock CK_RCV should be in-phase with the HDMI data signal to accurately recover the data. Therefore, this step comprises adjusting the phase of the data recovery clock CK_RCV to make it in-phase with the HDMI data signal;

Step S950: generating a reference clock CK_REF2 according to the phase detection signal UP/DN and the reference clock CK_REF1, where the reference clock CK_REF2 and the data recovery clock CK_RCV have the same frequency and a phase difference. If a phase difference Φ is used to adjust the reference clock CK_REF1 in the step S940, a phase difference (Φ+θ) or (Φ−θ) is used to adjust the reference clock CK_REF1. As a result, the phase of the reference clock CK_REF2 is ahead of or behind the data recovery clock CK_RCV by a phase difference θ, which is between 0° and 180°.

Step S960: detecting a transmission mode according to the reference clock CK_REF2 and the HDMI data signal to generate a mode signal MODE. To be more specific, this step uses the HDMI data signal to sample the reference clock CK_REF2 to generate the mode signal MODE. The mode signal MODE is dependent on a frequency relation between the HDMI data signal and the reference clock CK_REF2. This step can use a D flip-flop to generate the mode signal MODE by inputting the HDMI data signal to the clock input end of the D flip-flop, inputting the reference clock CK_REF2 to the data input end of the D flip-flop, and outputting the mode signal MODE at the output end of the D flip-flop. Waveforms showing the sampling examples are depicted in FIG. 5 and FIG. 6, which are detailed in the above descriptions. For example, if the transmission mode of the HDMI data signal is assumed to be HDMI 1.4 in the step S910 and thus the default frequency multiple is set to be 10 accordingly, a mode signal MODE with constant value proves that the assumption in the step S910 is correct and therefore the detected transmission mode is HDMI 1.4; however, on the other hand, a mode signal MODE with variant value proves that the assumption in the step S910 is wrong and therefore the detected transmission mode is HDMI 2.0. Similarly, the situation where the transmission mode is assumed to be HDMI 2.0 in the step S910 can be easily derived by person of ordinary skill in the art so descriptions are omitted for brevity.

Step S970: determining whether to change the frequency of the reference clock CK_REF1 or not according to the mode signal MODE. If the mode signal MODE indicates that a ratio of the frequency of the HDMI data signal to the frequency of the HDMI clock is equal to the default frequency multiple of the step S910, the fact that the detected transmission mode is the same as the assumed transmission mode can be assured, which means the data can be accurately recovered, so it is not required to change the frequency of the data recovery clock CK_RCV (i.e., the frequency of the reference clock CK_REF1); however, if the ratio is not equal to the default frequency multiple, the detected transmission mode is not the same as the assumed transmission mode, which means the data cannot be accurately recovered, so it is required to change the frequency of the clock CK_REF1.

Figure 10:
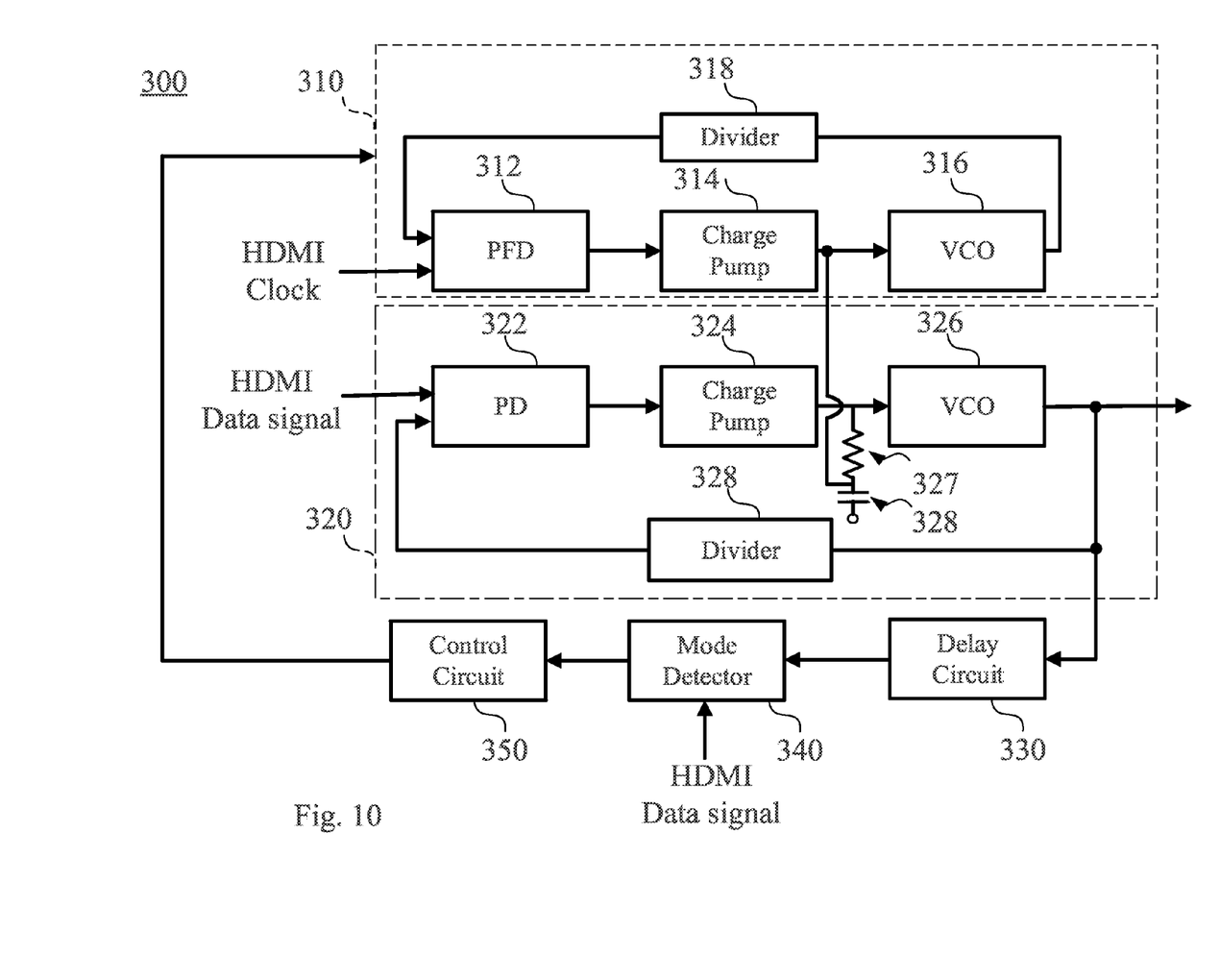
FIG. 10 illustrates a data receiving device based on an analog circuit according to an embodiment of the present invention.

In addition to the aforementioned digital circuit, the present invention can also be applied to an analog circuit. Please refer to FIG. 10, illustrating a data receiving device based on an analog circuit according to an embodiment of the present invention. The data receiving device 300 comprises a clock generating circuit 310, a clock generating circuit 320, a delay circuit 330, a mode detector 340 and a control circuit 350. The clock generating circuit 310 and the clock generating circuit 320 are managed to generate an output clock that is in phase with an input clock, where a ratio of the frequency of the output clock to the frequency of the input clock is equal to or larger than 1. The clock generating circuits 310 and 320 can be implemented by PLL's. When the clock generating circuit 310 is implemented by a PLL, it mainly comprises a phase frequency detector (PFD) 312, a charge pump 314, a voltage-controlled oscillator (VCO) 316, and a divider 318. The clock generating circuit 310 can generate a first reference clock by multiplying the frequency of the HDMI clock by a default frequency multiple of 10 or 40. The principles of the PLL are well-known to the person of ordinary skill in the art, and descriptions thereof are therefore omitted for brevity. When the clock generating circuit 310 completes phase lock, the charge pump 314 outputs a stable voltage, which is dependent on the first reference clock. When the clock generating circuit 320 is implemented by a PLL, it mainly comprises a PD 322, a charge pump 324, a VCO 326 and a divider 328. In addition, the clock generating circuit 320 further comprises a resistor 327 and a capacitor 328 for coupling the clock generating circuits 310 and 320. As shown in FIG. 10, the output voltage of the charge pump 314 is coupled to a point between the resistor 327 and the capacitor 328 so that the VCO 326 of the clock generating circuit 320 can generate a second reference clock by referring to the voltage; i.e., the second reference clock is actually dependent on the first reference clock. The other terminal of the capacitor 328 is coupled to a reference voltage level or ground. By the operations of the clock generating circuit 320, the second reference clock is in phase with the HDMI data signal, and therefore can be utilized to recover the HDMI data signal. To determine whether the clock generating circuit 310 multiplies the HDMI clock by a correct multiple or not, the delay circuit 330 delays the second reference clock by a predetermined time to generate a third reference clock. Then a mode detector 340 detects a transmission mode of the HDMI data signal according to the HDMI data signal and the third reference clock. The delay circuit 330 can be implemented by a butter, which includes series-connected NOT gates. The predetermined delay time is ideally larger than 0 and smaller a half period of the second reference clock. The mode detector 340 may be implemented by a sampling circuit, such as the D flip-flop in the aforementioned digital circuit or its equivalent circuit that samples the third reference clock by the HDMI data signal. The corresponding sampling waveforms are similar to FIG. 5 and FIG. 6 of the digital circuit, and the details are omitted for brevity. The control circuit 350 decides whether to control the clock generating circuit 310 to change the frequency multiple or not according to the mode signal generated by the mode detector 340. Because people of ordinary skill in the art can easily understand the details based on the operations of the digital circuit, repeated descriptions are omitted for brevity.

Figure 11:
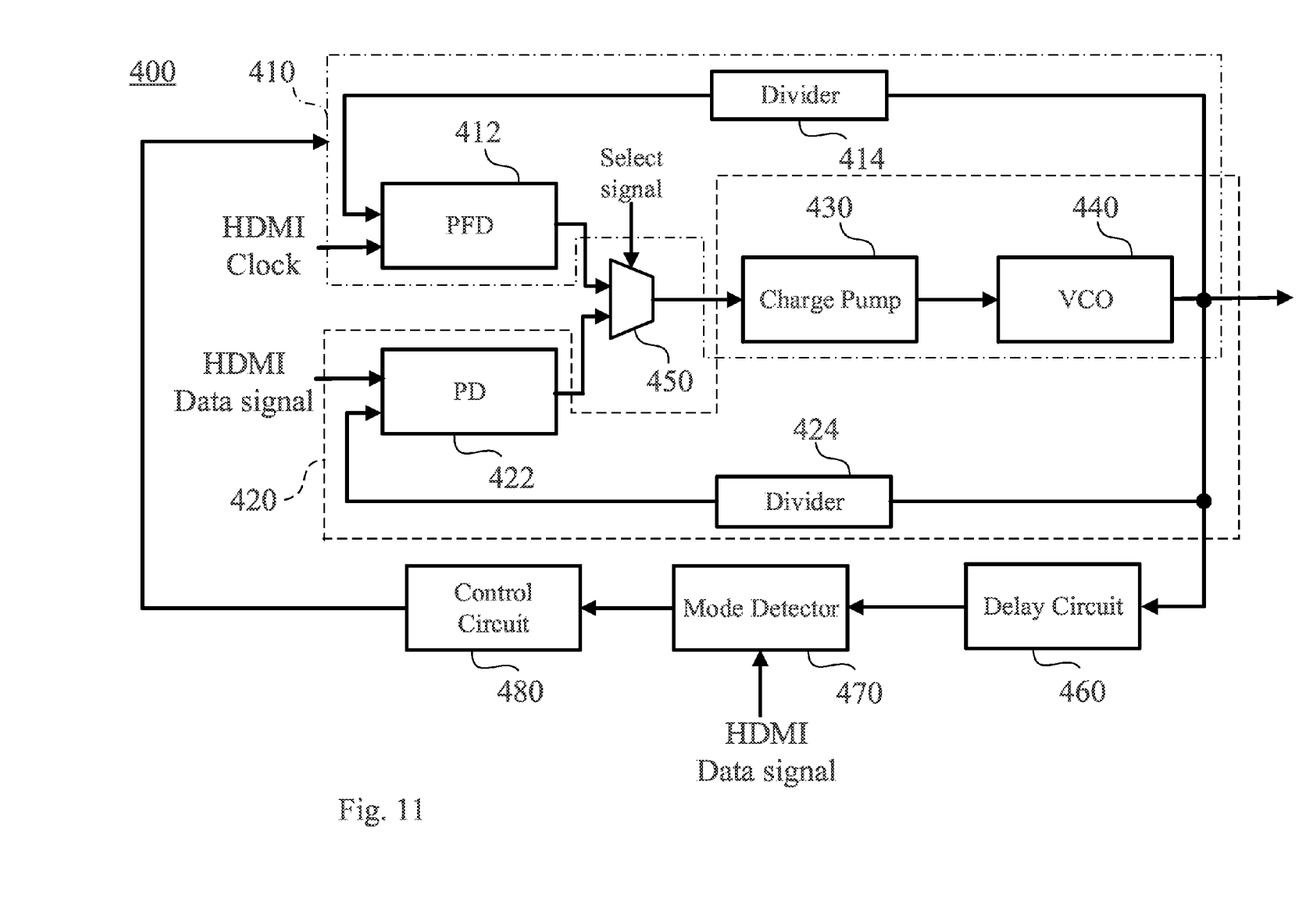
FIG. 11 illustrates a data receiving device based on an analog circuit according to another embodiment of the present invention.

Please refer to FIG. 11, illustrating a data receiving device based on an analog circuit according to another embodiment of the present invention. The data receiving device 400 comprises a clock generating circuit 410, a clock generating circuit 420, a multiplexer 450, a delay circuit 460, a mode detector 470 and a control circuit 480. The difference between this and the former embodiments lies in that when the clock generating circuit 410 and the clock generating circuit 420 are implemented by PLL's, these two circuits share a charge pump 430 and a VCO 440; in addition, the clock generating circuit 410 further comprises a PFD 412 and a divider 414, and the clock generating circuit 420 further comprises a PD 422 and a divider 424. The switch between the clock generating circuit 410 and the clock generating circuit 420 is controlled by the multiplexer 450. Initially, the control circuit 480 controls the multiplexer 450 by a select signal to make the PFD 412, the charge pump 430, the VCO 440, and the divider 414 form a loop; after the clock generating circuit 410 generates a first reference clock, a phase of which is locked according to the HDMI clock, the control circuit 480 controls the multiplexer 450 by the select signal to make the PD 422, the charge pump 430, the VCO 440 and the divider 424 form a loop. As a result, the clocking generating circuit 420 can perform a phase lock operation according to the first reference clock and the HDMI data signal and then generates a second reference clock accordingly. Details of other components are the same as or similar to the components having the same name in the former embodiment so repeated descriptions are omitted for brevity.

Figure 12:
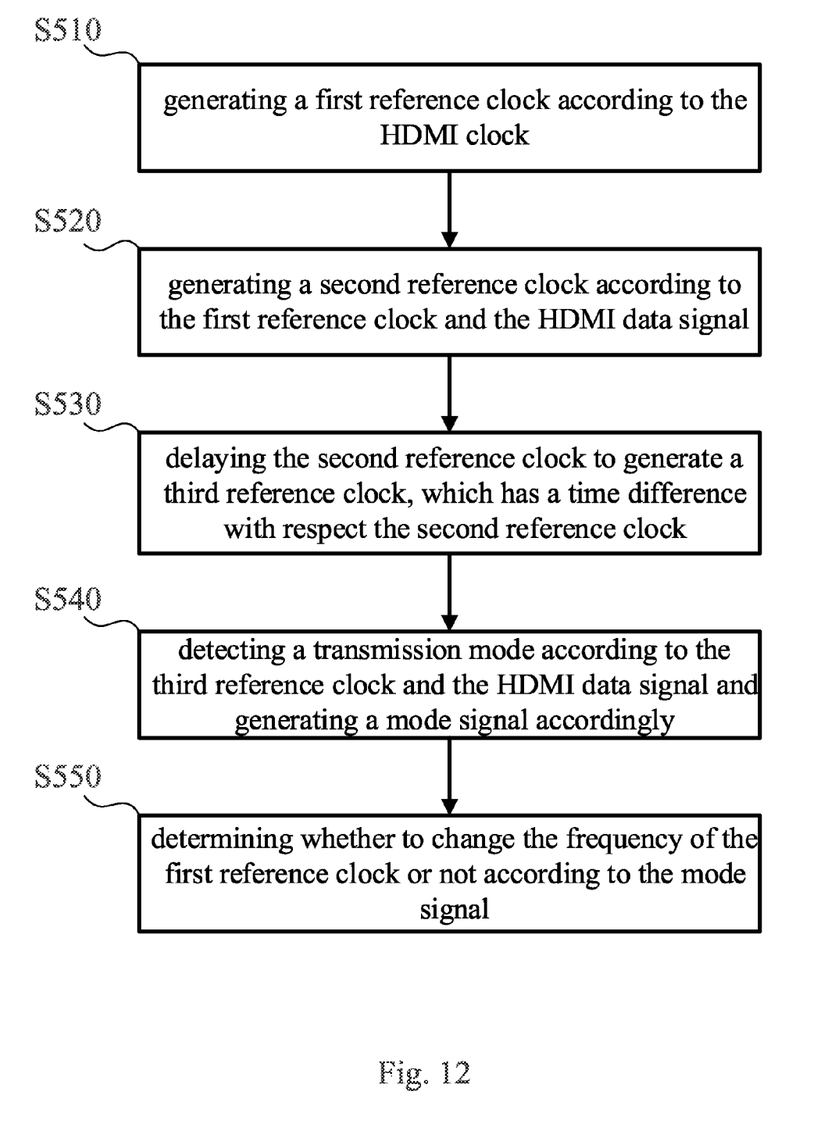
FIG. 12 illustrates flow chart of a data receiving method according to another embodiment of the present invention.

Please refer to FIG. 12, illustrating flow chart of a data receiving method according to another embodiment of the present invention. In addition to the aforementioned data receiving device based on analog circuits, the present invention also discloses a corresponding data receiving method, which is applied to a receiving end of HDMI for identifying a transmission mode of the data signal. This method is executed by the data receiving devices 300 and 400 or their equivalent devices. As shown in FIG. 12, one embodiment of the present invention comprises the following steps:

Step S510: generating a first reference clock according to the HDMI clock. This step assumes that the transmission mode of HDMI is HDMI 1.4 or HDMI 2.0, and uses a corresponding default frequency multiple (10 for HDMI 1.4 and 40 for HDMI 2.0) to generate the first reference clock so that a ratio of the frequency of the first reference clock to the frequency of the HDMI clock is the default frequency multiple;

Step S520: generating a second reference clock according to the first reference clock and the HDMI data signal. The frequency of the second reference clock is determined according to the frequency of the first reference clock, and generally they are set to be equal. The phase of the second reference clock is adjusted to be in-phase with the HDMI data signal so that the data of the HDMI data signal can be recovered;

Step S530: delaying the second reference clock to generate a third reference clock, which has a time difference with respect the second reference clock. Preferably, the time difference is larger than 0 and smaller than a half period of the second reference clock;

Step S540: detecting a transmission mode according to the third reference clock and the HDMI data signal and generating a mode signal accordingly. Practically, the mode signal is generated by sampling the third reference clock by the HDMI data signal. The sampling waveforms are similar to FIGS. 5 and FIG. 6 of digital circuits so repeated descriptions are omitted for brevity;

Step S550: determining whether to change the frequency of the first reference clock or not according to the mode signal. If the mode signal indicates that a ratio of the frequency of the HDMI data signal to the frequency of the HDMI clock is equal to the default frequency multiple of the step S510, the fact that the detected transmission mode is the same as the assumed transmission mode can be assured, which means the data can be accurately recovered, so it is not required to change the frequency of the first reference clock; however, if the ratio is not equal to the default frequency multiple, the detected transmission mode is not equal to the assumed transmission mode, which means the data cannot be accurately recovered, so it is required to change the frequency of the first reference clock.

Since people of ordinary skill in the art can appreciate the implementation detail and the modification thereto of the present method invention of FIG. 9 through the disclosure of the device invention of FIG. 2 and the method invention of FIG. 12 through the disclosure of the device inventions of FIG. 10 and FIG. 11, repeated and redundant description is thus omitted. Please note that there is no step sequence limitation for the method inventions as long as the execution of each step is applicable. Furthermore, the shape, size, and ratio of any element and the step sequence of any flow chart in the disclosed figures are just exemplary for understanding, not for limiting the scope of this invention. Besides, each aforementioned embodiment may include one or more features; however, this doesn't mean that one carrying out the present invention should make use of all the features of one embodiment at the same time, or should only carry out different embodiments separately. In other words, if an implementation derived from one or more of the embodiments is applicable, a person of ordinary skill in the art can selectively make use of some or all of the features in one embodiment or selectively make use of the combination of some or all features in several embodiments to have the implementation come true, so as to increase the flexibility of carrying out the present invention.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A data receiving device for identifying a transmission mode of a data signal, comprising:
   a clock generating circuit for generating a first reference clock according to a source clock;
   a phase detector for generating a phase detection signal according to the data signal and a data recovery clock;
   a phase adjusting circuit, coupled to the clock generating circuit and the phase detector, for adjusting a phase of the first reference clock according to the phase detection signal to generate the data recovery clock and outputting the data recovery clock to the phase detector and generating a second reference clock according to the phase detection signal and the first reference clock, the second reference clock and the data recovery clock having the same frequency and a phase difference;
   a mode detector, coupled to the phase adjusting circuit, for detecting the transmission mode according to the second reference clock and the data signal and generating a mode signal accordingly; and
   a control circuit, coupled to the mode detector and the clock generating circuit, for determining whether to control the clock generating circuit to change the frequency of the first reference clock or not according to the mode signal.

2. The data receiving device of claim 1, further comprising:
   a filtering circuit, coupled to the phase detector and the phase adjusting circuit, for low-pass filtering the phase detection signal so that the filtered phase detection signal has only the low frequency part;
   wherein, the phase adjusting circuit operates according to the filtered phase detection signal.

3. The data receiving device of claim 1, wherein the mode detector generates the mode signal by sampling the second reference clock by the data signal.

4. The data receiving device of claim 3, wherein the mode detector comprises a D flip-flop, which receives the data signal at a clock input end, receives the second reference clock at a data input end, and outputs the mode signal at an output end.

5. The data receiving device of claim 1, wherein the mode signal indicates that the transmission mode is a first transmission mode or a second transmission mode, and if the transmission mode is the first transmission mode, the frequency of the data signal is N times the frequency of the source clock; and if the transmission mode is the second transmission mode, the frequency of the data signal is M times the frequency of the source clock; M and N are both positive numbers and M is larger than N.

6. The data receiving device of claim 5, wherein if the mode signal indicates that the transmission mode is the first transmission mode and a ratio of the frequency of the first reference clock to the frequency of the source clock is not equal to N, or if the mode signal indicates that the transmission mode is the second transmission mode and a ratio of the frequency of the first reference clock to the frequency of the source clock is not equal to M, the control circuit controls the clock generating circuit to change the frequency of the first reference clock.

7. The data receiving device of claim 5, wherein the clock generating circuit is a phase locked loop, which multiplies the frequency of the source clock by M or N to generate the first reference clock.

8. The data receiving device of claim 5, wherein the first transmission mode and the second transmission mode correspond to different transmission modes of High Definition Multimedia Interface.

9. The data receiving device of claim 1, wherein the phase adjusting circuit comprises a first phase interpolator and a second phase interpolator, and the first phase interpolator generates the data recovery clock according to the first reference clock and the phase detection signal, and the second phase interpolator generates the second reference clock according to the first reference clock and the phase detection signal.

10. A data receiving method, performed by a data receiving device for identifying a transmission mode of a data signal, comprising:
    generating a first reference clock according to a source clock;
    generating a phase detection signal according to the data signal and a data recovery clock;
    generating the data recovery clock by adjusting a phase of the first reference clock according to the phase detection signal;
    generating a second reference clock according to the phase detection signal and the first reference clock, the second reference clock and the data recovery clock having the same frequency and a phase difference;
    detecting the transmission mode according to the second reference clock and the data signal and generating a mode signal accordingly; and
    determining whether to change the frequency of the first reference clock or not according to the mode signal.

11. The data receiving method of claim 10, wherein the mode signal indicates that the transmission mode is a first transmission mode or a second transmission mode, and if the transmission mode is the first transmission mode, the frequency of the data signal is N times the frequency of the source clock; and if the transmission mode is the second transmission mode, the frequency of the data signal is M times the frequency of the source clock; M and N are both positive numbers and M is larger than N.

12. The data receiving method of claim 11, wherein if the mode signal indicates that the transmission mode is the first transmission mode and a ratio of the frequency of the first reference clock to the frequency of the source clock is not equal to N, or if the mode signal indicates that the transmission mode is the second transmission mode and a ratio of the frequency of the first reference clock to the frequency of the source clock is not equal to M, the step of determining whether to change the frequency of the first reference clock or not according to the mode signal comprises:
    changing the frequency of the first reference clock.

13. The data receiving method of claim 11, wherein the step of generating the first reference clock according to a source clock comprises:
    multiplying the frequency of the source clock by M or N to generate the first reference clock.

14. A data receiving device for identifying a transmission mode of a data signal, comprising:
    a first clock generating circuit for generating a first reference clock according to a source clock;
    a second clock generating circuit, coupled to the first clock generating circuit, for generating a second reference clock according to the first reference clock and the data signal;
    a delaying circuit, coupled to the second clock generating circuit, for delaying the second reference clock to generate a third reference clock, the third reference clock and the second reference clock having a time difference;
    a mode detector, coupled to the delaying circuit, for detecting the transmission mode according to the third reference clock and the data signal and generating a mode signal accordingly; and
    a control circuit, coupled to the mode detector and the first clock generating circuit, for determining whether to control the first clock generating circuit to change the frequency of the first reference clock or not according to the mode signal.

15. The data receiving device of claim 14, wherein the mode detector generates the mode signal by sampling the third reference clock by the data signal.

16. The data receiving device of claim 14, wherein the mode signal indicates that the transmission mode is a first transmission mode or a second transmission mode, and if the transmission mode is the first transmission mode, the frequency of the data signal is N times the frequency of the source clock; and if the transmission mode is the second transmission mode, the frequency of the data signal is M times the frequency of the source clock; M and N are both positive numbers and M is larger than N.

17. The data receiving device of claim 16, wherein if the mode signal indicates that the transmission mode is the first transmission mode and a ratio of the frequency of the first reference clock to the frequency of the source clock is not equal to N, or if the mode signal indicates that the transmission mode is the second transmission mode and a ratio of the frequency of the first reference clock to the frequency of the source clock is not equal to M, the control circuit controls the clock generating circuit to change the frequency of the first reference clock.

18. A data receiving method, performed by a data receiving device for identifying a transmission mode of a data signal, comprising:
    generating a first reference clock according to a source clock;
    generating a second reference clock according to the first reference clock and the data signal;
    delaying the second reference clock to generate a third reference clock, the third reference clock and the second reference clock having a time difference;
    detecting the transmission mode according to the third reference clock and the data signal and generating a mode signal accordingly; and
    determining whether to change the frequency of the first reference clock or not according to the mode signal.

19. The data receiving method of claim 18, wherein the mode signal indicates that the transmission mode is a first transmission mode or a second transmission mode, and if the transmission mode is the first transmission mode, the frequency of the data signal is N times the frequency of the source clock; and if the transmission mode is the second transmission mode, the frequency of the data signal is M times the frequency of the source clock; M and N are both positive numbers and M is larger than N.

20. The data receiving method of claim 19, wherein if the mode signal indicates that the transmission mode is the first transmission mode and a ratio of the frequency of the first reference clock to the frequency of the source clock is not equal to N, or if the mode signal indicates that the transmission mode is the second transmission mode and a ratio of the frequency of the first reference clock to the frequency of the source clock is not equal to M, the step of determining whether to change the frequency of the first reference clock or not according to the mode signal comprises:
    changing the frequency of the first reference clock.

* * * * *